US008989412B2

(12) United States Patent
Fujise et al.

(10) Patent No.: US 8,989,412 B2
(45) Date of Patent: Mar. 24, 2015

(54) PIEZOELECTRIC ACOUSTIC TRANSDUCER

(75) Inventors: Akiko Fujise, Osaka (JP); Toshiyuki Matsumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/055,315

(22) PCT Filed: May 7, 2010

(86) PCT No.: PCT/JP2010/003134

§ 371 (c)(1),
(2), (4) Date: Jan. 21, 2011

(87) PCT Pub. No.: WO2010/137242

PCT Pub. Date: Dec. 2, 2010

(65) Prior Publication Data

US 2012/0057730 A1 Mar. 8, 2012

(30) Foreign Application Priority Data

May 25, 2009 (JP) ................................ 2009-124866

(51) Int. Cl.
*H04R 25/00* (2006.01)
*H04R 1/00* (2006.01)
(Continued)

(52) U.S. Cl.
CPC ................ *H04R 17/00* (2013.01); *H04R 1/288* (2013.01); *H04R 7/20* (2013.01); *H04R 2499/11* (2013.01); *H04R 2499/15* (2013.01)
USPC ............................ 381/190; 381/398; 310/330

(58) Field of Classification Search
None
See application file for complete search history.

(56) References Cited

U.S. PATENT DOCUMENTS 4,352,961 A * 10/1982 Kumada et al. ............... 455/350
4,654,554 A * 3/1987 Kishi ............................ 381/190
(Continued)

FOREIGN PATENT DOCUMENTS

JP 58-48200 3/1983
JP 62-6600 1/1987
(Continued)

OTHER PUBLICATIONS

Search Report issued Aug. 21, 2013 in corresponding Chinese Patent Application No. 201080002164.8.
(Continued)

*Primary Examiner* — Fred Guillermety
*Assistant Examiner* — Frantz Bataille
(74) *Attorney, Agent, or Firm* — Wenderoth, Lind & Ponack, L.L.P.

(57) ABSTRACT

A piezoelectric acoustic transducer (1) of the present invention includes a lower frame (78), a lower speaker circuit (20), an upper frame (77), an upper speaker circuit (10), and a surround (76). The upper speaker circuit (10) has a piezoelectric diaphragm (14) in which piezoelectric elements (16, 17), each having a structure that flat plate electrodes are disposed on top and bottom of a piezoelectric member, are mounted on top and bottom surfaces of a board (15). The lower speaker circuit (20) has a piezoelectric diaphragm (24) in which piezoelectric elements (26, 27), each having the same structure, are mounted on a top surface and a bottom surface of a board (25). The piezoelectric diaphragms (14, 24) are coupled to each other via coupling members (74, 75). At an application of a voltage, the piezoelectric diaphragms (14, 24) are caused to curve in directions opposite to each other. Having this structure, the piezoelectric acoustic transducer (1) has an increased displacement in a thickness direction thereof, and thereby achieving high quality sound with space-saving.

24 Claims, 9 Drawing Sheets

(51) Int. Cl.

| | |
|---|---|
| ***H01L 41/00*** | (2013.01) |
| ***H04R 17/00*** | (2006.01) |
| *H04R 1/28* | (2006.01) |
| *H04R 7/20* | (2006.01) |

(56) References Cited

U.S. PATENT DOCUMENTS

| | | | | |
|---|---|---|---|---|
| 5,804,906 | A | 9/1998 | Tsutsumi | |
| 5,907,625 | A * | 5/1999 | Kanai et al. | 381/190 |
| 6,064,746 | A * | 5/2000 | Nakamura et al. | 381/351 |
| 6,181,797 | B1 * | 1/2001 | Parrella et al. | 381/86 |
| 6,278,790 | B1 * | 8/2001 | Davis et al. | 381/398 |
| 6,978,032 | B2 * | 12/2005 | Ogura et al. | 381/190 |
| 7,180,225 | B2 * | 2/2007 | Sashida et al. | 310/330 |
| 7,486,004 | B2 * | 2/2009 | Allan et al. | 310/328 |
| 7,504,516 | B2 * | 3/2009 | Parthasaradhi et al. | 548/253 |
| 2002/0186860 | A1 * | 12/2002 | Ogura et al. | 381/398 |
| 2003/0099371 | A1 * | 5/2003 | Ogura et al. | 381/426 |
| 2003/0202672 | A1 * | 10/2003 | Yamauchi et al. | 381/190 |
| 2007/0177746 | A1 | 8/2007 | Kobayashi et al. | |
| 2008/0212807 | A1 * | 9/2008 | Wang | 381/190 |

FOREIGN PATENT DOCUMENTS

| | | |
|---|---|---|
| JP | 2002-291099 | 10/2002 |
| JP | 2003-230193 | 8/2003 |
| JP | 2003-274470 | 9/2003 |
| JP | 2004-364334 | 12/2004 |
| JP | 2005-507627 | 3/2005 |
| JP | 2008-522538 | 6/2008 |
| WO | 95/32602 | 11/1995 |
| WO | 03/038919 | 5/2003 |
| WO | 2005/004535 | 1/2005 |
| WO | 2006/059856 | 6/2006 |

OTHER PUBLICATIONS

English translation of JP 2003-274470 published Sep. 2003.

International Search Report issued Jul. 27, 2010 in corresponding International Application No. PCT/JP2010/003134.

Kohei Motoo et al., “Tailor-made Multilayer Piezoelectric Actuator Having Large Displacements and Forces”, Department of Micro-Nano Systems Engineering, Nagoya University, Transactions of the Japan Society of Mechanical Engineers, Version C, vol. 72, No. 722, Oct. 2006, pp. 232-239 (with English abstract).

James D. Ervin et al., “Recurve Piezoelectric-Strain-Amplifying Actuator Architecture”, IEEE/ASME Transactions on Mechatronics, vol. 3, No. 4, Dec. 1998, pp. 293-301.

* cited by examiner

PIEZOELECTRIC ACOUSTIC TRANSDUCER

TECHNICAL FIELD

The present invention relates to a piezoelectric acoustic transducer, and, more particularly, to a piezoelectric loudspeaker that achieves both space-saving and high quality sound.

BACKGROUND ART

Recently, there is an accelerating tendency that mobile devices, such as mobile phones, personal digital assistances (PDA), and portable navigation devices, are thinned and downsized. The need for thinner and smaller components to be mounted in audiovisual equipment and the like has also been increasing.

In general, electrodynamic loudspeakers are used as a loudspeaker for reproducing audio signals or music signals in the mobile devices. The electrodynamic loudspeakers, however, employ a driving type that requires a magnet and a voice coil, and thus it is difficult to reduce the thickness of the loudspeakers. Further, the electrodynamic loudspeakers use a magnetic circuit, and thus a problem arises that countermeasures must be taken against magnetic leakage, or the like. Therefore, piezoelectric loudspeakers, which have been widely used for reproducing sounds in the audiovisual equipment or the like, are attracting attention as a loudspeaker of a driving type that is suitable for reducing the thickness. Thus, there is an increasing tendency to mount piezoelectric loudspeakers in mobile devices.

Conventionally, the piezoelectric loudspeaker has been known as an acoustic transducer, in which a piezoelectric member is used for an electro acoustic transducer element, and which is used as a sound output means of small-sized devices (e.g., see Patent Literature 1). A structure of the piezoelectric loudspeaker is such that the piezoelectric element is bonded on a metal plate, or the like. Therefore, the piezoelectric loudspeaker is readily reduced in its thickness, as compared to the electrodynamic loudspeaker that requires a magnet and a voice coil. The piezoelectric loudspeakers also have an advantage that no countermeasure is required against the magnetic leakage. When viewed as an electric element, the piezoelectric loudspeakers operate as a capacitor, while the electrodynamic loudspeakers operate mainly as a resistance component. Therefore, the lower the frequency is, the higher the electric impedance becomes, and thereby the piezoelectric loudspeakers have an advantage that the power consumption in a low-frequency band is significantly low, as compared to the electrodynamic loudspeakers. For example, when used in mobile devices, the piezoelectric loudspeakers can reduce the power consumption over the electrodynamic loudspeakers in a normal voice-band, particularly in a frequency band ranging from 1 kHz to 2 kHz.

On the other hand, the piezoelectric loudspeakers have a disadvantage that an amount of displacement of a piezoelectric diaphragm is small, as compared to the electrodynamic loudspeakers, when the same voltage is applied. Because of this, in a low-frequency band where a large displacement is required, a sound pressure becomes small (i.e., voltage sensitivity becomes low), and thereby a problem arises that audio signals cannot be reproduced with a sufficient sound pressure. Therefore, in order to overcome the above problems, one of the following methods needs to be chosen.

A first method is a method of enlarging the area of the piezoelectric diaphragm to obtain the sound pressure. If the amount of displacement of the piezoelectric diaphragm is constant, the sound pressure of the piezoelectric loudspeaker is proportional to an effective vibration area of the piezoelectric diaphragm, and therefore the effective vibration area is to be enlarged. For example, if the effective vibration area of the piezoelectric diaphragm is doubled, the sound pressure is also doubled, that is, a sound pressure level increases by 6 dB.

A second method is a method of increasing a driving voltage to obtain the sound pressure. If the effective vibration area is constant, the amount of displacement of the piezoelectric diaphragm of the piezoelectric loudspeaker is proportional to the driving voltage, and therefore the driving voltage is to be increased. For example, if the driving voltage is doubled, the sound pressure is also doubled.

A third method is a method of multi-layering the piezoelectric element to obtain the sound pressure. The number of laminations of the piezoelectric elements is to be increased because driving force of the piezoelectric loudspeaker is proportional to the number of laminations of the piezoelectric elements, if the total thickness of the piezoelectric elements and the driving voltage are constant in a state where directions of deformations of the piezoelectric members align with each other. Therefore, if the number of laminations of the piezoelectric elements is increased, the sound pressure of the loudspeaker increases without the need for changing the effective vibration area of the piezoelectric diaphragm and the driving voltage.

CITATION LIST

Patent Literature

[Patent Literature 1] Japanese Laid-Open Patent Publication No. 2003-230193

SUMMARY OF THE INVENTION

Problems to be Solved by the Invention

However, the following problems, concerned with mounting the piezoelectric loudspeaker in the mobile devices, persists in the first through third methods described above, in aspects of disposition space and tone quality performance.

In the first method, the effective vibration area needs to be enlarged. However, how much the size can be enlarged is limited in the mobile devices or the audiovisual equipment, which require the reduction in thickness and size. Particularly, in a cabinet having a limited volume, the deterioration in a bass range reproduction performance due to an effect caused by insufficient volume at the back of the piezoelectric diaphragm is large.

In the second method, the driving voltage needs to be increased. However, a booster amplifier for driving the loudspeaker is separately required to increase the driving voltage, and thereby undesirably inviting an increase in space and cost, because of an increase in number of components.

In the third method, the number of laminations of the piezoelectric elements needs to be increased. However, the cost of the piezoelectric element increases according to the number of laminations of the piezoelectric elements. Further, the thickness of a piezoelectric member or an electrode per layer is constrained by a material used or a production method, and therefore the number of laminations of the piezoelectric elements is limited.

Accordingly, an objective of the present invention is to provide a piezoelectric acoustic transducer that allows effective reproduction of a high sound pressure in a limited space and with a limited cost.

Solution to the Problems

The present invention is directed to a piezoelectric acoustic transducer that vibrates in accordance with a voltage applied thereto. In order to achieve the above objective, the piezoelectric acoustic transducer of the present invention a plurality of piezoelectric diaphragms each having a piezoelectric element mounted on at least one main surface of a board; and at least one coupling member for aligning a vibration axis of the piezoelectric element of each of the plurality of piezoelectric diaphragms with each other, and for coupling adjacent piezoelectric diaphragms of the plurality of piezoelectric diaphragms to each other, and the polarity of the piezoelectric element of each of the plurality of piezoelectric diaphragms is set so that the adjacent piezoelectric diaphragms are displaced in directions opposite to each other, in accordance with a voltage applied thereto.

One of the piezoelectric diaphragms that is disposed on one side is coupled, in the center of the board, to a non-vibrating fixed frame of the piezoelectric acoustic transducer via the at least one coupling member, and the piezoelectric diaphragm is coupled to the piezoelectric diaphragm adjacent thereto on end portions, of the board, perpendicular to directions in which the piezoelectric element expands or contracts. Alternatively, in one of the piezoelectric diaphragms that is disposed on one side, end portions, of the board, perpendicular to directions in which the piezoelectric element expands or contracts, are coupled to a non-vibrating fixed frame of the piezoelectric acoustic transducer, and the one piezoelectric diaphragm is coupled, in a center of the board, to the piezoelectric diaphragm adjacent thereto via the at least one coupling member.

Preferably, the piezoelectric acoustic transducer further includes a surround, which is capable of expansion and contraction, for supporting the board of one of the piezoelectric diaphragms that is disposed on an other side, by means of the non-vibrating fixed frame of the piezoelectric acoustic transducer. Typically, the plurality of piezoelectric diaphragms are formed in rectangular shapes. Typically, the piezoelectric element has a structure in which a printed wiring formed on a surface of the board and a flat plate electrode interpose therebetween a piezoelectric member. It is conceivable that the piezoelectric member is any of piezoelectric single crystal, piezoelectric ceramic, and a piezoelectric polymer.

The adjacent piezoelectric diaphragms may be electrically connected with each other via a conductive part provided inside or outside of the at least one coupling member. In this case, the conductive part, provided outside of the at least one coupling member, can be integrally formed with the board which is included in the piezoelectric diaphragm, and which has formed on the surface thereof the printed wiring.

Advantageous Effects of the Invention

According to the present invention, the piezoelectric diaphragms of the plurality of speaker circuits are alternately displaced in antiphase. Accordingly, greater displacement can be obtained using the voltage used for one speaker circuit, and therefore, the voltage sensitivity in the low-frequency band is increased.

DESCRIPTION OF EMBODIMENTS

Hereinafter, description is given specifically of a piezoelectric acoustic transducer of the present invention with reference to the accompanying drawings.

In embodiments provided below, description is given of examples in which the piezoelectric acoustic transducer of the present invention is applied to a loudspeaker. The piezoelectric acoustic transducer of the present invention, however, may be applied to a vibrator, a sensor, a microphone, and the like.

First Embodiment

Figure 1:
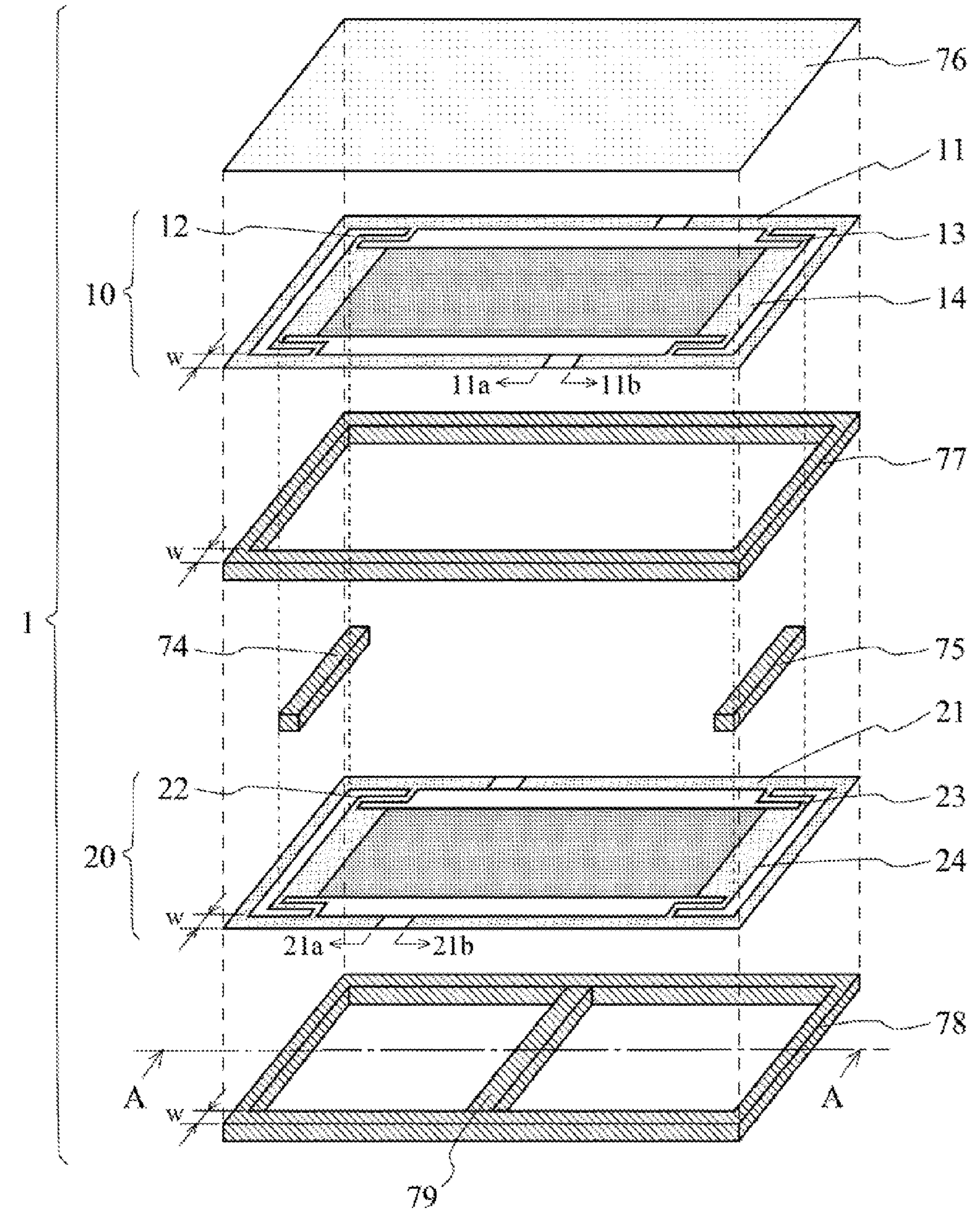
FIG. 1 is an exploded view showing a structure of a piezoelectric acoustic transducer 1 according to a first embodiment of the present invention.
Figure 2:
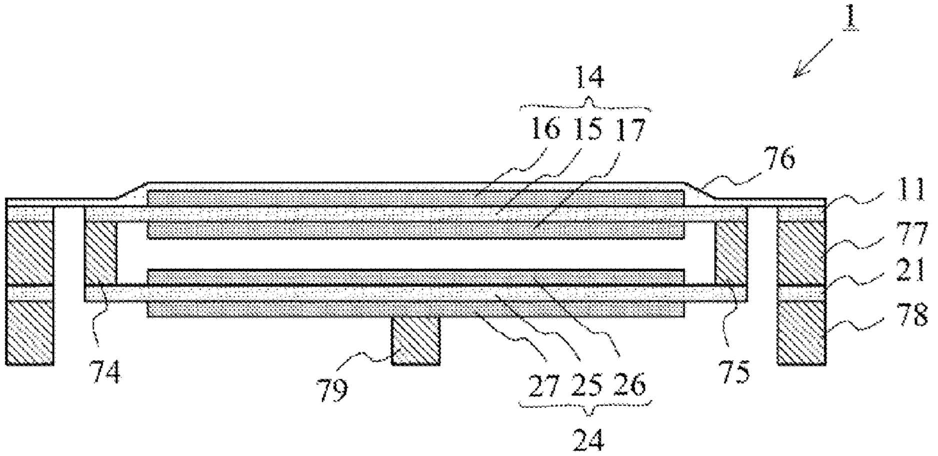
FIG. 2 is a cross-sectional view of the piezoelectric acoustic transducer 1 taken along a line A-A.
Figure 3A:
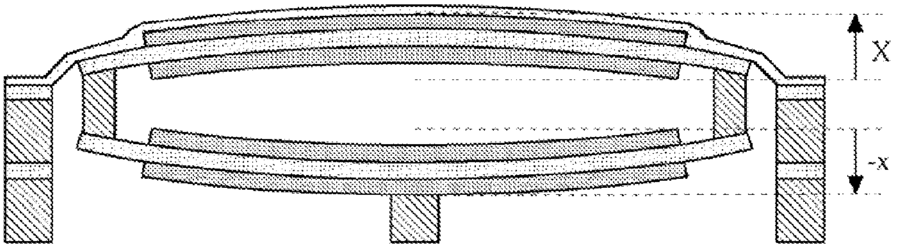
FIG. 3A is a diagram illustrating a vibration operation of the piezoelectric acoustic transducer 1.
Figure 3B:
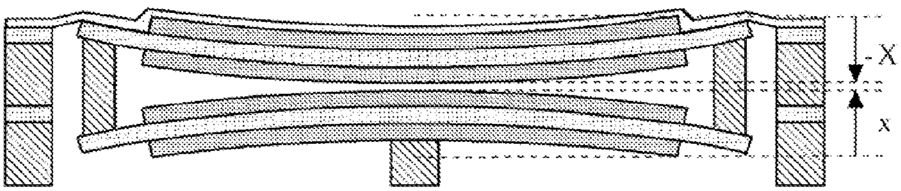
FIG. 3B is a diagram illustrating a vibration operation of the piezoelectric acoustic transducer 1.

FIG. 1 is an exploded view showing a structure of a piezoelectric acoustic transducer 1 according to a first embodiment of the present invention. FIG. 2 is a cross-sectional view of the piezoelectric acoustic transducer 1, shown in FIG. 1, taken along a line A-A. FIG. 3A and FIG. 3B are diagrams each illustrating a vibration operation of the piezoelectric acoustic transducer 1 shown in FIG. 1.

The piezoelectric acoustic transducer 1 according to the first embodiment of the present invention includes an upper speaker circuit 10, a lower speaker circuit 20, coupling members 74 and 75, a surround 76, an upper frame 77, and a lower frame 78. The upper speaker circuit 10, the lower speaker circuit 20, the surround 76, the upper frame 77, and the lower frame 78 are each formed in a polygon with four right angles that has the same size. FIG. 1 illustrates an example in a case where this shape is rectangle having a perimeter R.

First, description is given of a structure of the piezoelectric acoustic transducer 1.

The upper speaker circuit 10 includes an outer frame portion 11, first conductive portions 12, second conductive portions 13, and a piezoelectric diaphragm 14. The outer frame portion 11 is a board shaped in a rectangular frame having the perimeter R and a predetermined width w. On this outer frame portion 11, a first electric wiring 11*a* and a second electric wiring 11*b* are formed, being insulated from each other. The piezoelectric diaphragm 14 includes the following components: a board 15, formed in a rectangular shape, which has a perimeter r smaller than an inner perimeter of the outer frame portion 11; a piezoelectric element 16 mounted on a portion of a top surface of the board 15; and a piezoelectric element 17 mounted on a portion of a bottom surface of the board 15. This piezoelectric diaphragm 14 is connected with the outer frame portion 11 via the first conductive portions 12 and the second conductive portions 13 such that the piezoelectric diaphragm 14 can be curved. Typically, the outer frame portion 11, the board 15, the first conductive portions 12, and the second conductive portions 13 are not configured by using separate components, but are integrally formed by punching a board material.

The piezoelectric elements 16 and 17 are thin flat elements each having a structure (not shown) that flat plate electrodes are disposed on top and bottom of a piezoelectric member. The piezoelectric member is formed of a piezoelectric material that expands or contracts in accordance with a voltage applied thereto. Each of the electrodes is formed of an electrically conductive material, such as a metal. The electrode formed on the surface of the board is also called a printed wiring. Electrodes of each of the piezoelectric elements 16 and 17 are electrically connected with a first electric wiring 11*a* and a second electric wiring 11*b*, which are formed on the outer frame portion 11, via the board 15, the first conductive portions 12, and the second conductive portions 13 so that a voltage having polarity, which causes the piezoelectric elements 16 and 17 to expand or contract in directions opposite to each other, is concurrently applied between the respective electrodes of each of the piezoelectric elements 16 and 17. Because of this connection, the upper speaker circuit 10 curves in up-down directions in accordance with the voltage applied between the first electric wiring 11*a* and the second electric wiring 11*b*.

The lower speaker circuit 20 also has a structure similar to that of the upper speaker circuit 10, and includes an outer frame portion 21, first conductive portions 22, second conductive portions 23, and a piezoelectric diaphragm 24. The outer frame portion 21 is a board shaped in a rectangular frame having the perimeter R and the width w. On this outer frame portion 21, a first electric wiring 21*a* and a second electric wiring 21*b* are formed, being insulated from each other. The piezoelectric diaphragm 24 includes the following components: a board 25 having the perimeter r; a piezoelectric element 26 mounted on a portion of a top surface of the board 25; and a piezoelectric element 27 mounted on a portion of a bottom surface of the board 25. This piezoelectric diaphragm 24 is connected with the outer frame portion 21 via the first conductive portions 22 and the second conductive portions 23 such that the piezoelectric diaphragm 24 can be curved.

The piezoelectric elements 26 and 27 are thin flat elements each having a structure (not shown) that flat plate electrodes are disposed on top and bottom of a piezoelectric member. Electrodes of each of the piezoelectric elements 26 and 27 are electrically connected with a first electric wiring 21*a* and a second electric wiring 21*b*, which are formed on the outer frame portion 21, via the board 25, the first conductive portions 22, and the second conductive portions 23 so that a voltage having polarity, which causes the piezoelectric elements 26 and 27 to expand or contract in directions opposite to each other, is concurrently applied between the respective electrodes of each of the piezoelectric elements 26 and 27. Because of this connection, the lower speaker circuit 20 operates for curving in up-down directions in accordance with the voltage applied between the first electric wiring 21*a* and the second electric wiring 21*b*.

The first electric wiring 11*a* and the second electric wiring 11*b* of the upper speaker circuit 10 are each electrically connected with either of the first electric wiring 21*a* and the second electric wiring 21*b* of the lower speaker circuit 20 such that a voltage having polarity, which causes the upper speaker circuit 10 and the lower speaker circuit 20 to curve in directions opposite to each other, is concurrently applied between the electrodes disposed on the respective speaker circuits.

The upper frame 77 is formed of a substance in a rectangular frame shape, having the perimeter R and the width w. The lower frame 78 is formed of a substance in a rectangular frame shape, having the perimeter R and the width w, and a beam part 79 is disposed in the center of the lower frame 78. In the lower speaker circuit 20, a bottom surface of the outer frame portion 21 and a portion of the electrode disposed on a bottom surface of the piezoelectric element 27 are bonded with a top surface of the lower frame 78, and a top surface of the outer frame portion 21 is bonded with a bottom surface of the upper frame 77. In the upper speaker circuit 10, a bottom surface of the outer frame portion 11 is bonded with a top surface of the upper frame 77, and the surround 76 formed of a laminate material, which is capable of expansion and contraction, is mounted across a top surface of the upper speaker circuit 10 (see FIG. 2). Portions of the board 15, on which neither the piezoelectric elements 16 nor 17 of the upper speaker circuit 10 are mounted, and portions of the board 25, on which neither the piezoelectric element 26 nor 27 of the lower speaker circuit 20 are mounted, are coupled (structurally connected) to each other via the coupling members 74 and 75 such that a vibration axis of each of the piezoelectric elements 16 and 17 aligns with a vibration axis of each of the piezoelectric elements 26 and 27. Preferably, the coupling members 74 and 75 are each formed of a material having rigidity lower than those of the boards 15 and 25.

Next, description is given of vibration operations of the piezoelectric acoustic transducer 1 having the structure described above.

When a voltage having a first polarity is applied between the first electric wiring 11*a* and the second electric wiring 11*b* of the upper speaker circuit 10, the piezoelectric element 16 and the piezoelectric element 17 expand or contract in directions opposite to each other. As a result, the board 15 curves in accordance with a difference in expansion and contraction between these two piezoelectric elements, and the piezoelectric diaphragm 14 is displaced by X in a thickness direction thereof. On the other hand, this voltage having the first polarity is also applied between the first electric wiring 21*a* and the second electric wiring 21*b* of the lower speaker circuit 20, causing the piezoelectric element 26 and the piezoelectric element 27 to expand or contract in directions opposite to each other. As a result, the board 25 curves in accordance with a difference in expansion and contraction between these two piezoelectric elements, and the piezoelectric diaphragm 24 is displaced by −x in a thickness direction thereof. See FIG. 3A.

Further, when a voltage having a second polarity, which is an opposite polarity to the first polarity, is applied between the first electric wiring 11*a* and the second electric wiring 11*b* of the upper speaker circuit 10, the respective directions, in which the piezoelectric element 16 and the piezoelectric element 17 expand or contract, are changed. As a result, the board 15 curves in a direction opposite to that in the case where the voltage having the first polarity is applied, and thus the piezoelectric diaphragm 14 is displaced by −X in the thickness direction thereof. Meanwhile, the respective directions, in which the piezoelectric element 26 and the piezoelectric element 27 expand or contract, are also changed. As a result, the board 25 curves in a direction opposite to that in the case where the voltage having the first polarity is applied. Thus, the piezoelectric diaphragm 24 is displaced by x in the thickness direction thereof. See FIG. 3B.

The piezoelectric diaphragm 24 is coupled to a non-vibrating fixed frame of the piezoelectric acoustic transducer 1 via the beam part 79 which functions as a coupling member. The piezoelectric diaphragm 14 and the piezoelectric diaphragm 24 are coupled to the coupling members 74 and 75. Accordingly, the entire displacement of the piezoelectric acoustic transducer 1, when the voltage having the first polarity is applied, is represented by "X+x" which is a difference between the displacement X of the piezoelectric diaphragm 14 and the displacement −x of the piezoelectric diaphragm 24. See FIG. 3A. Further, the entire displacement of the piezoelectric acoustic transducer 1, when the voltage having the second polarity is applied, is represented by "−X−x" which is a difference between the displacement −X of the piezoelectric diaphragm 14 and the displacement x of the piezoelectric diaphragm 24. See FIG. 3B. Accordingly, the piezoelectric acoustic transducer 1 that has two piezoelectric diaphragms can obtain greater displacement by using the same voltage, as compared to a piezoelectric acoustic transducer that has one piezoelectric diaphragm. Namely, a higher sound pressure can be generated.

As described above, according to the piezoelectric acoustic transducer 1 of the first embodiment of the present invention, the piezoelectric diaphragm 14 of the speaker circuit 10 and the piezoelectric diaphragm 24 of the speaker circuit 20 are displaced in respective directions opposite to each other, and thereby displacement greater than that in the case where one speaker circuit is used can be obtained by using the same voltage. Therefore, the voltage sensitivity in the low-frequency band is increased. Further, as compared to the first and the third methods described in background art, the piezoelectric acoustic transducer 1 having high quality sound, which is space-saving and low cost, and which has excellent voltage sensitivity in the low-frequency band, can be achieved.

Further, according to the piezoelectric acoustic transducer 1 of the first embodiment of the present invention, the piezoelectric diaphragms 14 and 24, each formed in a rectangular shape, are supported by the conductive portions 12, 13, and the conductive portions 22, and 23, respectively, such that the piezoelectric diaphragms 14 and 24 each can be curved. According to this, resonance of each of the piezoelectric diaphragms 14 and 24 in the long side directions is efficiently excited, and thereby, the piezoelectric diaphragms 14 and 24 are subjected to vibrate in the low-frequency. Therefore, it is possible to reproduce the bass with high quality sound (ameliorate the reproduction limit of a bass range).

Figure 4:
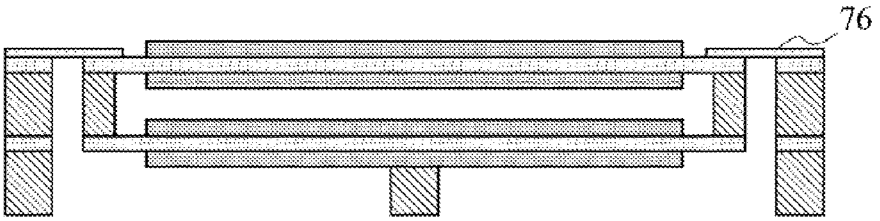
FIG. 4 is a cross-sectional view showing another structure of the piezoelectric acoustic transducer 1 according to the first embodiment of the present invention.

The surround 76 is mounted on the upper speaker circuit 10 to insulate an antiphase sound wave, which is generated from the bottom of the piezoelectric acoustic transducer 1, and which interferes with a sound wave emitted to the front of the piezoelectric acoustic transducer 1, and thereby, preventing the reduction of the sound pressure. Therefore, the surround 76 may support the piezoelectric diaphragm 14 flexibly without obstructing the displacement of the piezoelectric diaphragm 14 in the thickness direction. Thus, the surround 76 need not be mounted across the top surface of the upper speaker circuit 10, as shown in the first embodiment of the present invention, and may be configured so as to fill gaps formed between the piezoelectric diaphragm 14 and the outer frame portion 11. See FIG. 4.

Moreover, the structures of the coupling members 74 and 75 are not limited to those of the embodiment shown in FIG. 1, in which the coupling members 74 and 75, formed in rectangular shapes, couple the piezoelectric diaphragm 14 and the piezoelectric diaphragm 24 to each other in end portions of the boards 15 and 25. For example, the structures of the coupling members 74 and 75 may be formed in cubical shapes or cylindrical shapes such that the piezoelectric diaphragm 14 and the piezoelectric diaphragm 24 are coupled to each other at four corners of each of the boards 15 and 25. According to the such structures, the resonance of each of the piezoelectric diaphragms 14 and 24 in diagonal directions is efficiently excited. Therefore, it is possible to ameliorate the reproduction limit of the bass range. Further, the resonance of each of the piezoelectric diaphragms 14 and 24 in the short side directions (which have a higher resonance frequency than that in the diagonal directions) is efficiently excited. Therefore, it is possible to obtain greater displacement in the frequency band between the resonance frequency in the diagonal directions and the resonance frequency in the short side directions.

Second Embodiment

Figure 5:
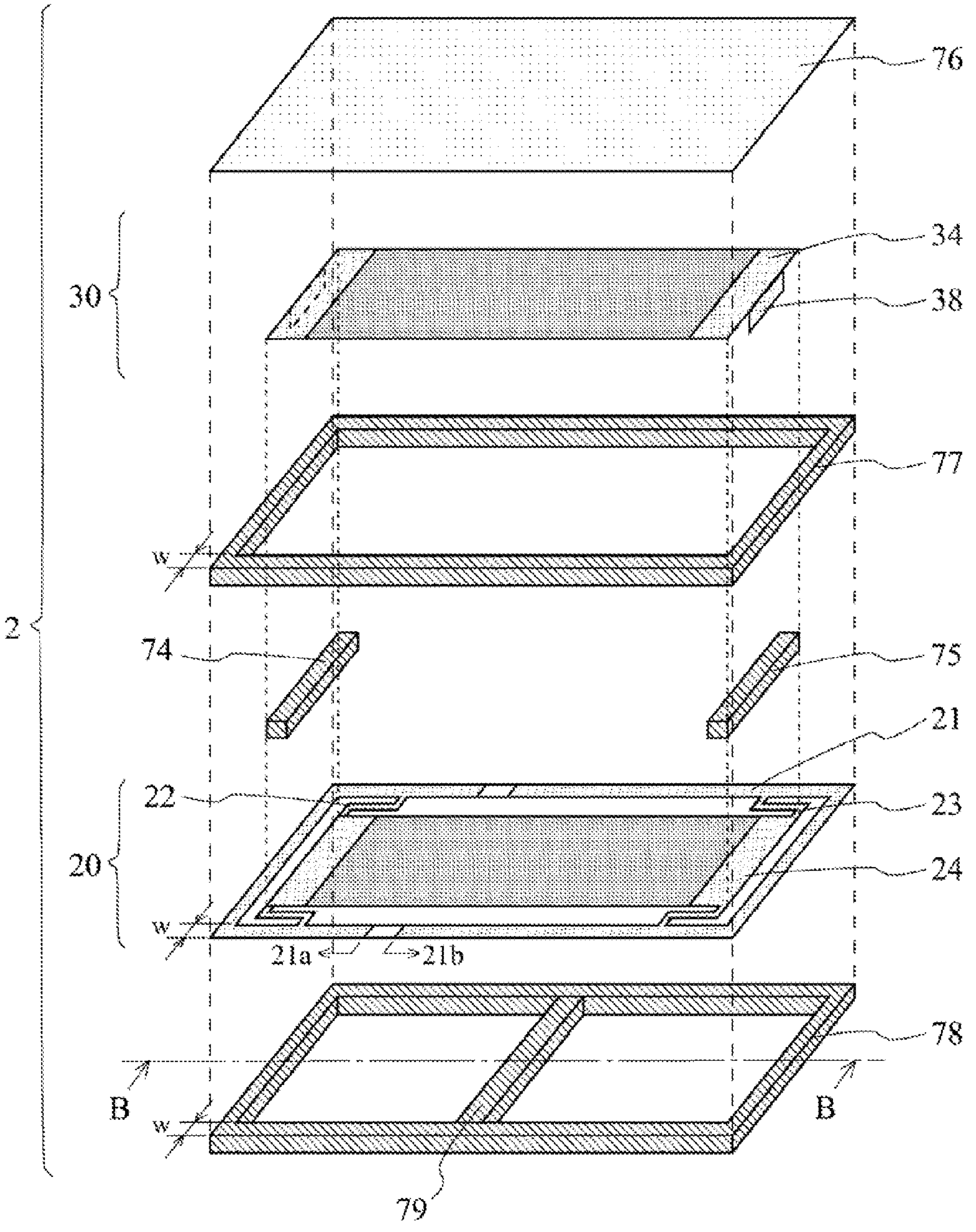
FIG. 5 is an exploded view showing a structure of a piezoelectric acoustic transducer 2 according to a second embodiment of the present invention.
Figure 6:
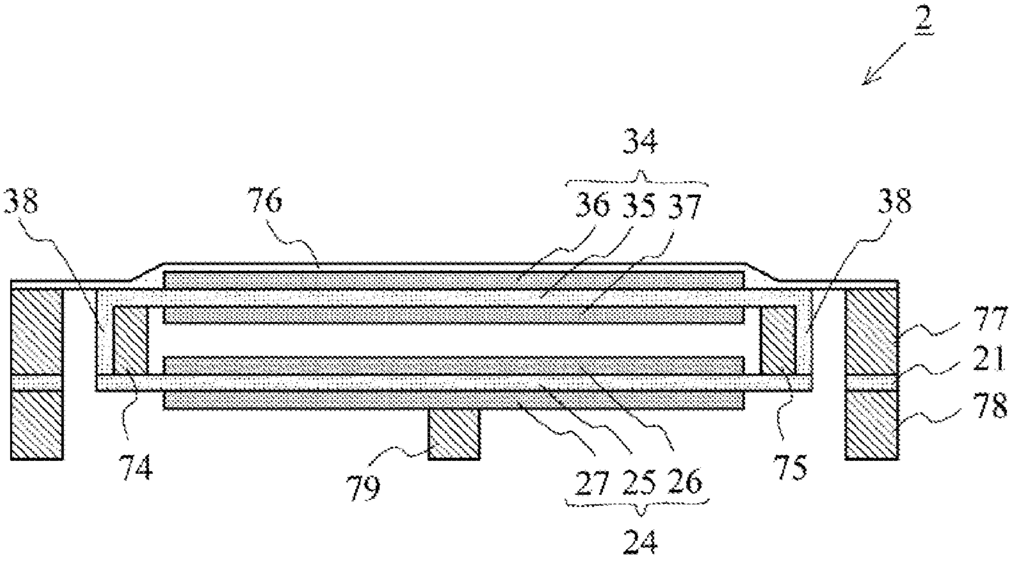
FIG. 6 is a cross-sectional view of the piezoelectric acoustic transducer 2 taken along a line B-B.

FIG. 5 is an exploded view showing a structure of a piezoelectric acoustic transducer 2 according to a second embodiment of the present invention. FIG. 6 is a cross-sectional view of the piezoelectric acoustic transducer 2, shown in FIG. 5, taken along a line B-B.

The piezoelectric acoustic transducer 2 according to the second embodiment of the present invention includes an upper speaker circuit 30, a lower speaker circuit 20, coupling members 74 and 75, a surround 76, an upper frame 77, and a lower frame 78. This piezoelectric acoustic transducer 2 is different from the piezoelectric acoustic transducer 1 described above in a configuration of the upper speaker circuit 30. Hereinafter, the same reference characters are given to the components that are the same as those of the piezoelectric acoustic transducer 1, and description thereof is omitted. Hereinafter, different configurations are mainly described.

The upper speaker circuit 30 includes a piezoelectric diaphragm 34 and third conductive portions 38. Similar to the piezoelectric diaphragm 14 described above, the piezoelectric diaphragm 34 includes the following components: a board 35, formed in a rectangular shape, which has a perimeter r; a piezoelectric element 36 mounted on a portion of a top surface of the board 35; and a piezoelectric element 37 mounted on a portion of a bottom surface of the board 35. The structures of the piezoelectric elements 36 and 37 are the same as those of the piezoelectric elements 16 and 17, respectively. The third conductive portions 38 are each disposed on the board 35 in a predetermined shape, and plays a role to electrically connect the board 35 of the upper speaker circuit

30 with the board 25 of the lower speaker circuit 20. Specifically, the third conductive portions 38 electrically connect electrodes disposed on top and bottom of each of the piezoelectric elements 36 and 37 of the upper speaker circuit 30 with respective electrodes disposed on top and bottom of each of the piezoelectric elements 26 and 27 of the lower speaker circuit 20 such that, when a voltage having polarity is applied between the first electric wiring 21*a* and the second electric wiring 21*b*, the piezoelectric diaphragm 24 and the piezoelectric diaphragm 34 are displaced in directions opposite to each other.

As described above, according to the piezoelectric acoustic transducer 2 of the second embodiment of the present invention, the piezoelectric diaphragms of the respective two speaker circuits are electrically connected with each other via the third conductive portions 38. Therefore, the piezoelectric diaphragm 34 of the upper speaker circuit 30 need not be supported by the outer frame, and thereby the greater displacement and the linearity of the vibration can be secured, in addition to the effects obtained by the first embodiment.

In the second embodiment, an example is given in which the third conductive portions 38, which are disposed along the surfaces of the coupling members 74 and 75, are used to electrically connect the piezoelectric diaphragms 24 and 34 with each other. The piezoelectric diaphragms 24 and 34, however, may be electrically connected with each other through conductive portions which are provided inside of the coupling members 74 and 75 (e.g., through-holes).

Third Embodiment

Figure 7:
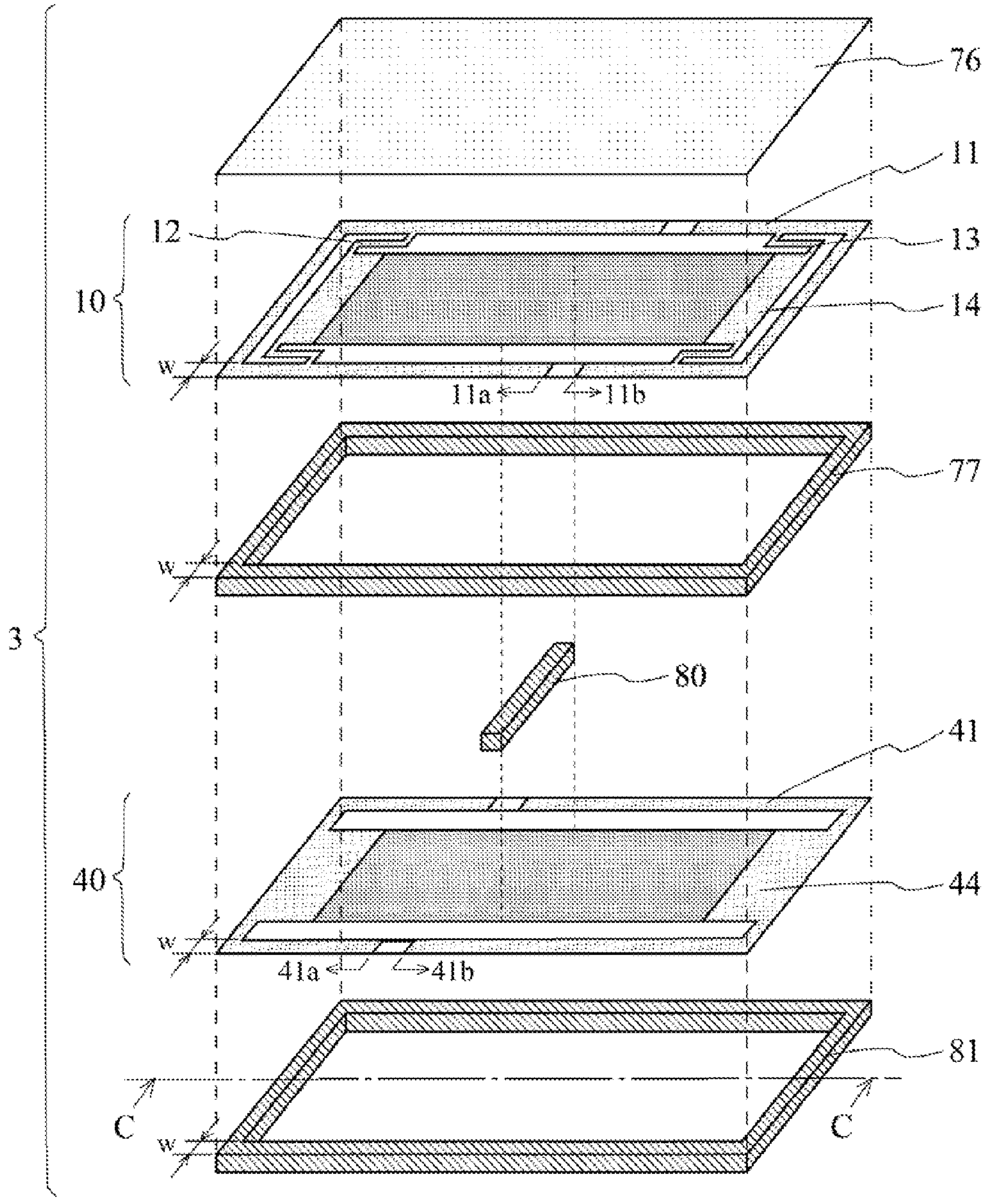
FIG. 7 is an exploded view showing a structure of a piezoelectric acoustic transducer 3 according to a third embodiment of the present invention.
Figure 8:
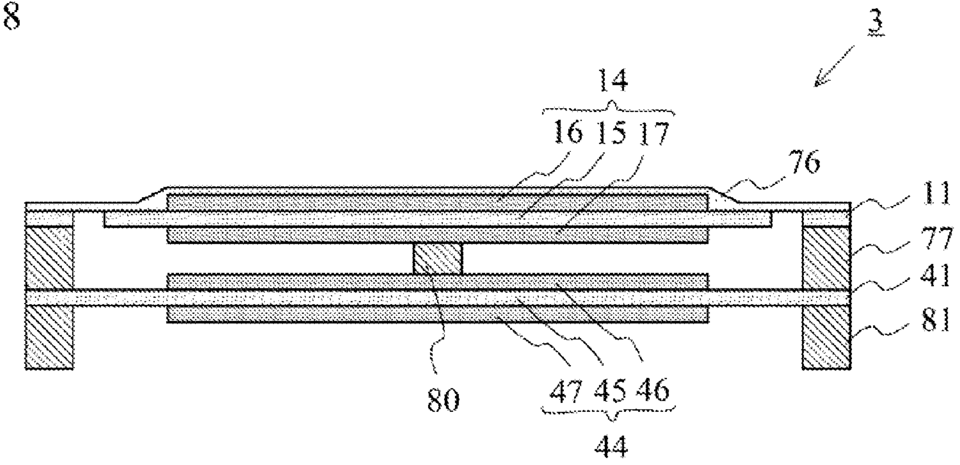
FIG. 8 is a cross-sectional view of the piezoelectric acoustic transducer 3 taken along a line C-C.
Figure 9A:
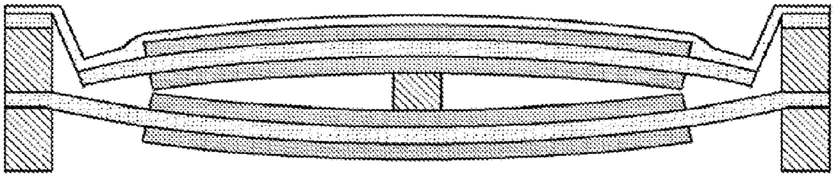
FIG. 9A is a diagram illustrating a vibration operation of the piezoelectric acoustic transducer 3.
Figure 9B:
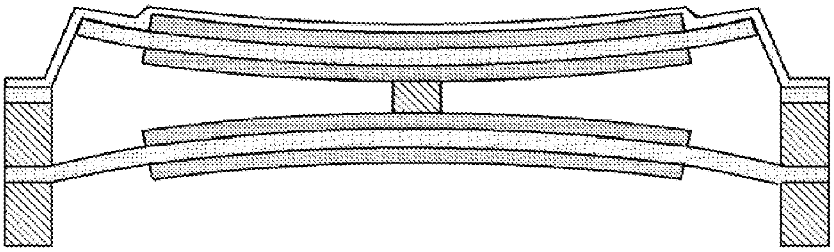
FIG. 9B is a diagram illustrating another vibration operation of the piezoelectric acoustic transducer 3.

FIG. 7 is an exploded view showing a structure of a piezoelectric acoustic transducer 3 according to a third embodiment of the present invention. FIG. 8 is a cross-sectional view of the piezoelectric acoustic transducer 3, shown in FIG. 7, taken along a line C-C. FIGS. 9A and 9B are diagrams each illustrating a vibration operation of the piezoelectric acoustic transducer 3 shown in FIG. 7.

The piezoelectric acoustic transducer 3 according to the third embodiment of the present invention includes an upper speaker circuit 10, a lower speaker circuit 40, a coupling member 80, a surround 76, an upper frame 77, and a lower frame 81. This piezoelectric acoustic transducer 3 is different from the piezoelectric acoustic transducer 1 described above in terms of configurations of the lower speaker circuit 40, the coupling member 80, and the lower frame 81. Hereinafter, the same reference characters are given to the components that are the same as those of the piezoelectric acoustic transducer 1, and description thereof is omitted. Different configurations are mainly described.

The lower speaker circuit 40 includes an outer frame portion 41 and a piezoelectric diaphragm 44. The outer frame portion 41 is a board shaped in a rectangular frame having a perimeter R and a width w. On this outer frame portion 41, a first electric wiring 41*a* and a second electric wiring 41*b* are formed, being insulated from each other. The piezoelectric diaphragm 44 includes the following components: a board 45, formed in a rectangular shape, which couples the short sides of the outer frame portion 41; a piezoelectric element 46 mounted on a portion of a top surface of the board 45; and a piezoelectric element 47 mounted on a portion of a bottom surface of the board 45. The structures of the piezoelectric elements 46 and 47 are the same as those of the piezoelectric elements 16 and 17, respectively. This piezoelectric diaphragm 44 is connected with the outer frame portion 41 such that the piezoelectric diaphragm 44 can be curved. Typically, the outer frame portion 41 and the board 45 are integrally formed by punching a board material.

The lower frame 81 is formed of a substance in a rectangular frame shape, having the perimeter R and the width w. In the lower speaker circuit 40, the bottom surface of the outer frame portion 41 is bonded with a top surface of the lower frame 81, and a top surface of the outer frame portion 41 is bonded with the bottom surface of the upper frame 77. Further, an electrode, disposed on bottom of the piezoelectric element 17 of the upper speaker circuit 10, and an electrode, disposed on top of piezoelectric element 46 of the lower speaker circuit 40, are structurally connected with each other at the center portions thereof via the coupling member 80. Preferably, this coupling member 80 is formed of a material having rigidity lower than those of the boards 15 and 45. The vibration operations of the piezoelectric acoustic transducer 3 having this structure are as shown in FIGS. 9A and 9B.

As described above, according to the piezoelectric acoustic transducer 3 of the third embodiment of the present invention, two speaker circuits are coupled to each other merely via the coupling member 80. Therefore, the number of components and materials cost can be reduced, in addition to the effects obtained by the first embodiment.

Examples are given of devices and materials used for the components of the piezoelectric acoustic transducer.

For the board, a general-purpose plastic material (such as a polycarbonate, a polyalylate film, a polyethylene terephthalate, or a polyimide), or a material having an insulation property, such as a liquid crystal polymer, is used. For the piezoelectric member, a piezoelectric single crystal, a piezoelectric ceramic, or a piezoelectric polymer is used. For the electrode, a membrane material which includes one of copper, aluminum, titanium, silver, and the like, or an alloy membrane material using thereof is used. For the surround, a flexible plastic material (such as polyethersulfone), a rubber polymer material (such as an SBR, an NBR, or acrylonitrile), or the like, is used. For the coupling member, the general-purpose plastic material, the rubber polymer material (such as the SBR, the NBR, or the acrylonitrile), the liquid crystal polymer, or the like, is used.

OTHER EMBODIMENTS

Figure 10A:
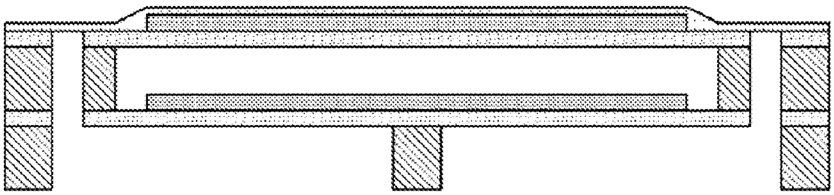
FIG. 10A is a cross-sectional view of structuring for a piezoelectric acoustic transducer according to another embodiment of the present invention.
Figure 10B:
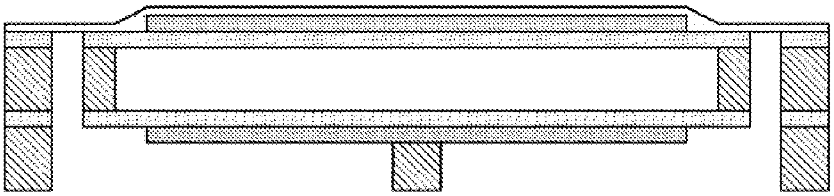
FIG. 10B is a cross-sectional view of a structuring for a piezoelectric acoustic transducer according to still another embodiment of the present invention.

In the first through third embodiments described above, examples are described where each piezoelectric diaphragm has the piezoelectric elements mounted on both of the top surface and the bottom surface of the board. However, a piezoelectric diaphragm having the piezoelectric element mounted on either the top surface or the bottom surface of the board is also applicable to the piezoelectric acoustic transducer of the present invention (e.g., FIGS. 10A and 10B).

Figure 11:
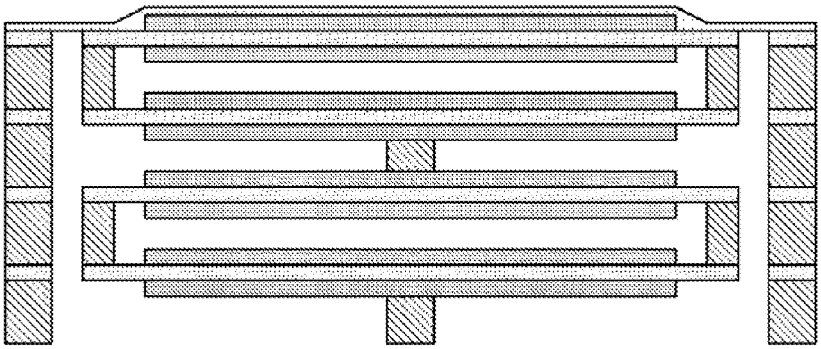
FIG. 11 is a cross-sectional view of a structuring for a piezoelectric acoustic transducer according to still another embodiment of the present invention.

Further, in the first through third embodiments described above, description is given of the structure having two speaker circuits coupled to each other. However, a structure having three or more speaker circuits coupled to one another is also applicable to the piezoelectric acoustic transducer of the present invention (e.g., FIG. 11).

[Mounting Example 1 of Piezoelectric Acoustic Transducer]

Figure 12:
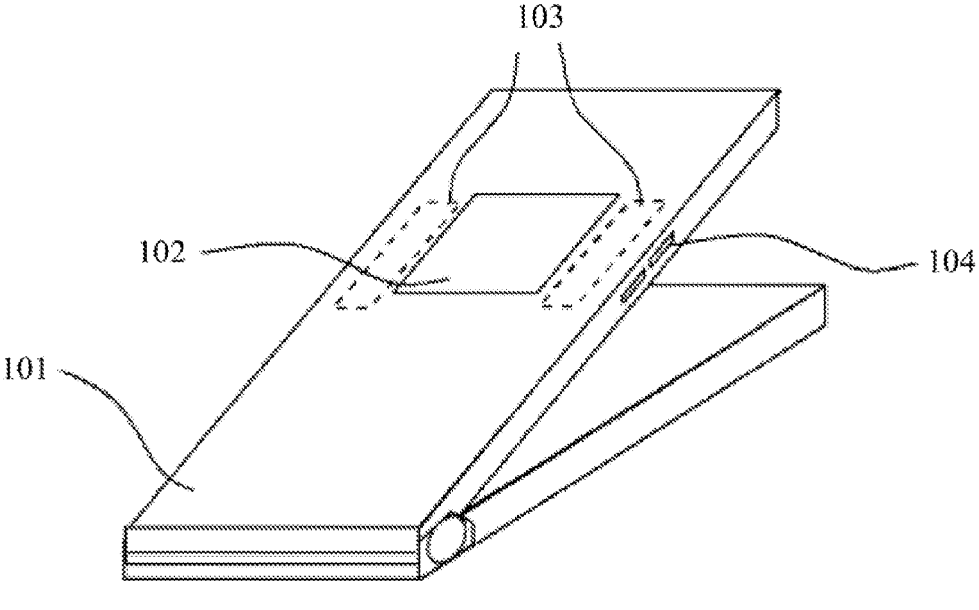
FIG. 12 is an external view of the piezoelectric acoustic transducers of the present invention in a mounting example 1.

FIG. 12 is an external view of the piezoelectric acoustic transducers, of the present invention, which are mounted in a mobile phone terminal. In FIG. 12, piezoelectric acoustic transducers 103 are any of the piezoelectric acoustic transducers 1 through 3 of the present invention described above, and are disposed on both sides of a display 102 which is provided in a housing 101 of the mobile phone terminal.

Sounds generated from these piezoelectric acoustic transducers 103 are emitted through sound holes 104 to the external space.

As described in the first through third embodiments, each of the piezoelectric acoustic transducers 103 of the present invention can achieve space-saving and high quality sound, without the necessity of an increased number of the components. Therefore, by mounting the piezoelectric acoustic transducers 103, a mobile phone terminal achieving reduction in thickness, and high quality sound, can be readily designed.

[Mounting Example 2 of Piezoelectric Acoustic Transducer]

Figure 13:
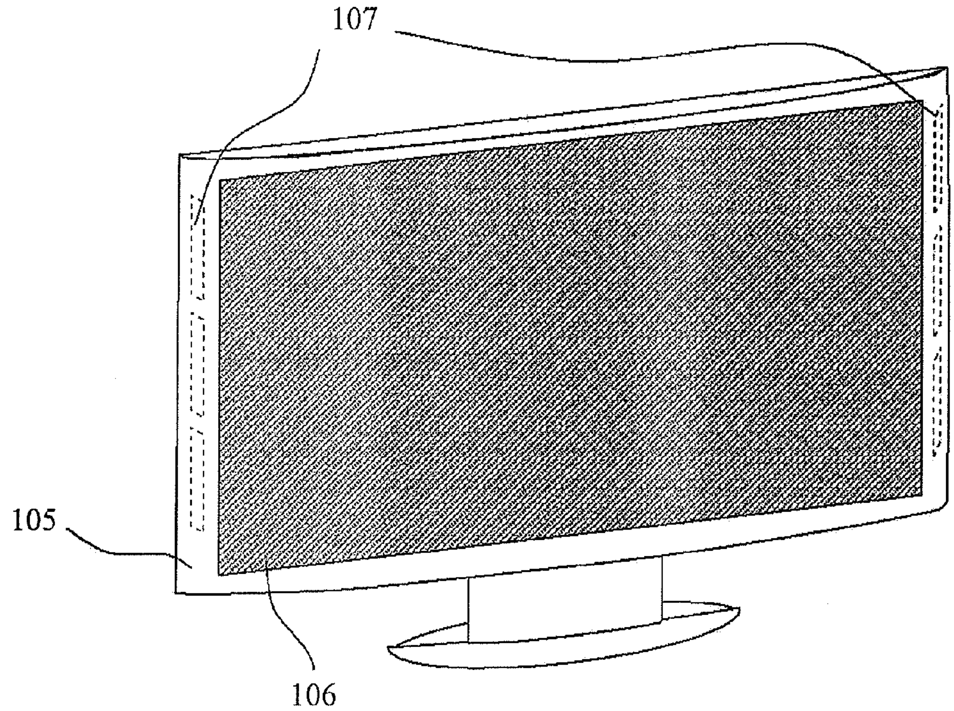
FIG. 13 is an external view of the piezoelectric acoustic transducers of the present invention in a mounting example 2.

FIG. 13 is an external view of the piezoelectric acoustic transducers, of the present invention, which are mounted in a flat screen television. In FIG. 13, piezoelectric acoustic transducers 107 of the present invention are any of the piezoelectric acoustic transducers 1 through 3 of the present invention described above, and are disposed on both sides of a display 106 which is provided in a housing 105 of the flat screen television.

In general, a region, in which a loudspeaker is mounted in the housing 105 of the flat screen television, is very restricted and a volume of the cabinet is small. Therefore, by mounting the piezoelectric acoustic transducers 107, the flat screen television achieving reduction in thickness, and high quality sound, can be readily designed. Particularly, the use of each of the piezoelectric acoustic transducers 107, as a loudspeaker for bass reproduction (woofer), realizes a sense of presence of the audio-visual content to be reproduced, without increasing the installation space.

[Mounting Example 3 of Piezoelectric Acoustic Transducer]

If the piezoelectric acoustic transducer of the present invention is directly mounted in the mobile phone terminal, the flat screen television, or the like, a problem arises that the vibration caused during the operation propagates to the housing, and thereby unwanted sound (such as excitation caused by the natural vibration of the housing) is likely to occur. Therefore, in such a case, preferably, a vibration isolation and a vibration control are performed, as described in the following, at a time when the piezoelectric acoustic transducer is mounted in the housing.

Figure 14:
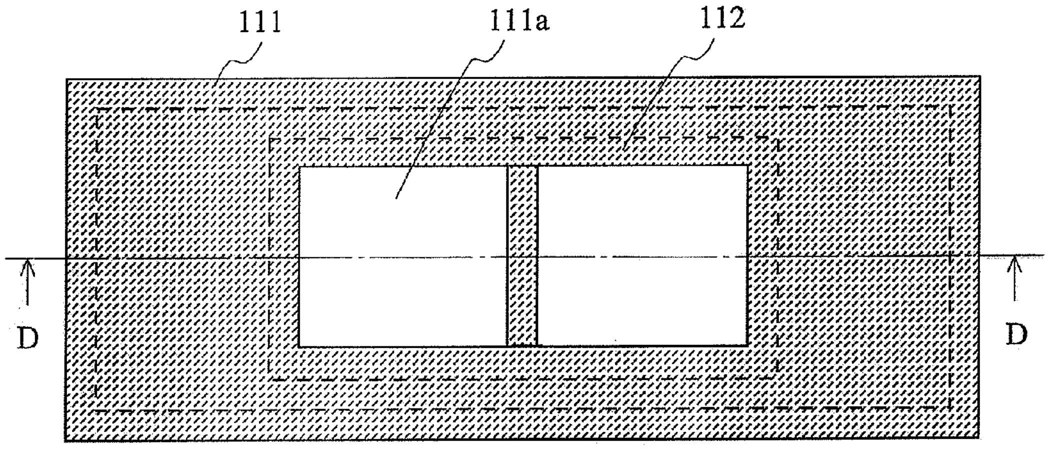
FIG. 14 is a top view of the piezoelectric acoustic transducer of the present invention in a mounting example 3.
Figure 15:
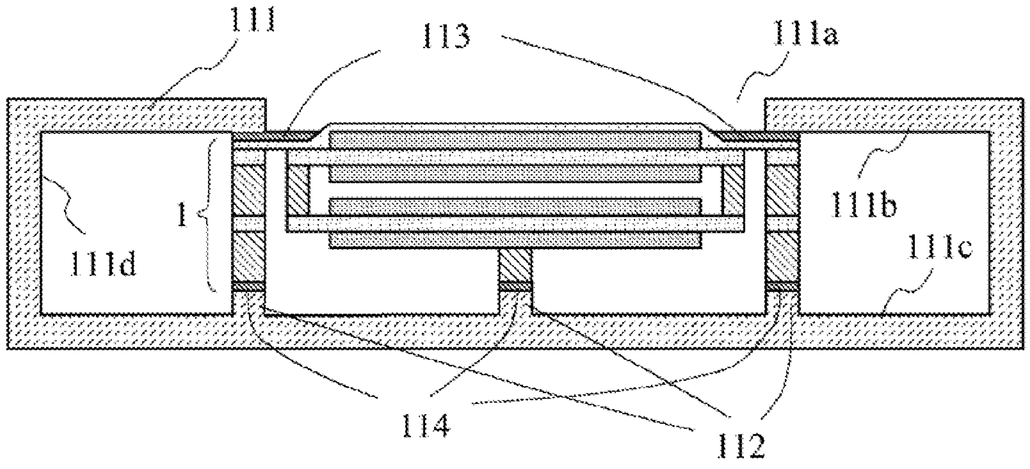
FIG. 15 is a cross-sectional view of a housing 111, taken along a line D-D, in which the piezoelectric acoustic transducer 1 is mounted.

FIG. 14 is a top view of a housing 111 of the mobile phone terminal, the flat screen television, or the like, in which the piezoelectric acoustic transducer of the present invention is mounted. FIG. 15 is a cross-sectional view of the housing 111, shown in FIG. 14, taken along a line D-D, in which the piezoelectric acoustic transducer 1 according to the first embodiment is mounted.

The housing 111 is a box having an opening portion 111*a*, and includes projections 112 on a lower interior wall 111*c*. The bottom portion of the piezoelectric acoustic transducer 1 is mounted in the housing 111 such that bottom surfaces of the lower frame 78 and the beam part 79 are mounted on the projections 112 which interpose therebetween a vibration control member 114. The top portion of the piezoelectric acoustic transducer 1 is mounted in the housing 111 such that merely a portion, of a top surface of the surround 76, which corresponds to the upper frame 77, is fixed to an upper interior wall 111*b*, of the housing 111, which interposes therebetween a vibration isolation member 113.

Provision of the vibration isolation member 113 can make it possible to prevent the vibration, caused by the piezoelectric acoustic transducer 1, from propagating to a top surface of the housing 111. Further, provision of the vibration control member 114 can make it possible to fix the frame parts of the piezoelectric acoustic transducer 1 to the housing 111 via the projections 112, and, at the same time, to prevent the vibration, caused by the piezoelectric acoustic transducer 1, from propagating to a bottom surface of the housing 111. Accordingly, the occurrence of the unwanted sound, which is caused by the resonance of the housing 111, can be prevented, in addition to the effects described above. The piezoelectric acoustic transducer 1 may be mounted in the housing 111 via one of the upper interior wall 111*b*, the lower interior wall 111*c*, and a side interior wall 111*d*.

INDUSTRIAL APPLICABILITY

A piezoelectric acoustic transducer of the present invention is applicable to a loudspeaker, a vibrator, a sensor, a microphone, and the like, and is useful particularly to achieve both space-saving and high quality sound.

DESCRIPTION OF THE REFERENCE CHARACTERS

1, 2, 3, 103, 107 piezoelectric acoustic transducer
10, 20, 30, 40 speaker circuit
11, 21, 41 outer frame portion
11*a*, 11*b*, 21*a*, 21*b*, 41*a*, 41*b* electric wiring
12, 13, 22, 23, 38 conductive portion
14, 24, 34, 44 piezoelectric diaphragm
15, 25, 35, 45 board
16, 17, 26, 27, 36, 37, 46, 47 piezoelectric element
74, 75, 80 coupling member
76 surround
77, 78, 81 frame
79 beam part
101, 105, 111 housing
102, 106 display
104 sound hole
111*a* opening portion
111*b*, 111*c*, 111*d* interior wall
112 projection
113 vibration isolation member
114 vibration control member

The invention claimed is:

1. A piezoelectric acoustic transducer that vibrates in accordance with a voltage applied thereto, the piezoelectric acoustic transducer comprising:

a first non-vibrating fixed frame;

a first piezoelectric diaphragm having first and second opposite surfaces and including a first board and a first piezoelectric element mounted on a main surface of the first board;

a second piezoelectric diaphragm having first and second opposite surfaces and including a second board and a second piezoelectric element mounted on a main surface of the second board, the first surface of the first piezoelectric diaphragm and the second surface of the second piezoelectric diaphragm facing toward each other, and the second surface of the first piezoelectric diaphragm and the first surface of the second piezoelectric diaphragm facing away from each other, the first surface of the second piezoelectric diaphragm being not coupled with the first piezoelectric diaphragm, the second piezoelectric element being disposed at said first surface of the second piezoelectric diaphragm;

a plurality of coupling members which couple the first piezoelectric diaphragm and the second piezoelectric diaphragm to each other and align a vibration axis of the first piezoelectric element of the first piezoelectric diaphragm with a vibration axis of the second piezoelectric element of the second piezoelectric diaphragm; and a surround which is capable of expansion and contraction and is disposed on the first surface of the second piezoelectric diaphragm in such a manner as to cover an entirety of the first surface of the second piezoelectric diaphragm from above the second piezoelectric element, the surround being configured to insulate an antiphase sound wave which is generated from a bottom of the piezoelectric acoustic transducer and which interferes with a sound wave emitted to the front of the piezoelectric acoustic transducer, wherein the polarity of each of the first and second piezoelectric elements is set so that the first and second piezoelectric diaphragms are displaced in directions opposite to each other, in accordance with a voltage applied thereto, wherein the first non-vibrating fixed frame is disposed at a position opposing the second piezoelectric diaphragm with the first piezoelectric diaphragm being interposed therebetween, and is coupled to the first piezoelectric diaphragm at a center of the first board, wherein the first non-vibrating fixed frame includes a beam, wherein a void is disposed on either side of the beam at positions under the first piezoelectric diaphragm, and wherein the coupling members couple the first piezoelectric diaphragm to the second piezoelectric diaphragm at end portions of the first board and along a direction perpendicular to directions in which the first piezoelectric element of the first piezoelectric diaphragm expands and contracts.

2. The piezoelectric acoustic transducer of claim 1, wherein the first and second piezoelectric diaphragms have a rectangular shape, and wherein the first piezoelectric diaphragm is coupled to the second piezoelectric diaphragm at corners of the first board or at short sides of the first board.

3. The piezoelectric acoustic transducer of claim 1, wherein the first piezoelectric element of the first piezoelectric diaphragm has a structure in which a printed wiring formed on a surface of the first board and a flat plate electrode interpose therebetween a piezoelectric member.

4. The piezoelectric acoustic transducer of claim 1, wherein the first piezoelectric element of the first piezoelectric diaphragm has a structure in which a printed wiring formed on a surface of the first board and a flat plate electrode interpose therebetween a piezoelectric member, and wherein the second piezoelectric element of the second piezoelectric diaphragm has a structure in which a printed wiring formed on a surface of the second board and a flat plate electrode interpose therebetween a piezoelectric member.

5. The piezoelectric acoustic transducer of claim 1, wherein the first and second piezoelectric diaphragms are electrically connected with each other via a conductive part provided inside or outside of the plurality of coupling members.

6. The piezoelectric acoustic transducer of claim 1, wherein the first piezoelectric element of the first piezoelectric diaphragm has a structure in which a printed wiring formed on a surface of the first board and a flat plate electrode interpose therebetween a piezoelectric member, wherein the first and second piezoelectric diaphragms are electrically connected with each other via a conductive part provided inside or outside of the plurality of coupling members, and the conductive part is provided outside of the plurality of coupling members and is integrally formed with the first board.

7. The piezoelectric acoustic transducer of claim 1, wherein the first piezoelectric diaphragm and the second piezoelectric diaphragm are spaced apart in a height direction, wherein the first piezoelectric diaphragm extends from a first edge thereof to a second edge thereof in a width direction perpendicular to the height direction, and wherein the non-vibrating fixed frame is disposed between the first edge and the second edge of the first piezoelectric diaphragm in the width direction.

8. The piezoelectric acoustic transducer of claim 1, wherein the first piezoelectric diaphragm and the second piezoelectric diaphragm are spaced apart in a height direction, wherein the first piezoelectric diaphragm extends from a first edge thereof to a second edge thereof in a width direction perpendicular to the height direction, wherein the non-vibrating fixed frame is disposed between the first edge and the second edge of the first piezoelectric diaphragm in the width direction, and wherein the coupling members are disposed respectively at the first edge and the second edge of the first piezoelectric diaphragm.

9. A piezoelectric acoustic transducer that vibrates in accordance with a voltage applied thereto, the piezoelectric acoustic transducer comprising:

a first piezoelectric diaphragm having first and second opposite surfaces and including a first board and a first piezoelectric element mounted on a main surface of the first board;

a second piezoelectric diaphragm having first and second opposite surfaces and including a second board and a second piezoelectric element mounted on a main surface of the second board, the first surface of the first piezoelectric diaphragm and the second surface of the second piezoelectric diaphragm facing toward each other, and the second surface of the first piezoelectric diaphragm and the first surface of the second piezoelectric diaphragm facing away from each other, the first surface of the second piezoelectric diaphragm being not coupled with the first piezoelectric diaphragm, the second piezoelectric element being disposed at said first surface of the second piezoelectric diaphragm, a coupling member which couples the first piezoelectric diaphragm and the second piezoelectric diaphragm to each other and aligns a vibration axis of the first piezoelectric element of the first piezoelectric diaphragm with a vibration axis of the second piezoelectric element of the second piezoelectric diaphragm; and a surround which is capable of expansion and contraction and is disposed on the first surface of the second piezoelectric diaphragm in such a manner as to cover an entirety of the first surface of the second piezoelectric diaphragm from above the second piezoelectric element, the surround being configured to insulate an antiphase sound wave which is generated from a bottom of the piezoelectric acoustic transducer and which interferes with a sound wave emitted to the front of the piezoelectric acoustic transducer, wherein the polarity of each of the first and second piezoelectric elements is set so that the first and second piezoelectric diaphragms are displaced in directions opposite to each other, in accordance with a voltage applied thereto, wherein the first piezoelectric diaphragm is coupled to a first non-vibrating fixed frame at end portions of the first board and along a direction perpendicular to directions in which the first piezoelectric element of the first piezoelectric diaphragm expands and contracts, wherein the coupling member couples the first piezoelectric diaphragm to the second piezoelectric diaphragm in a center of the first and second boards, wherein the coupling member includes a beam, and wherein a void is disposed on either side of the beam at positions between the first piezoelectric diaphragm and the second piezoelectric diaphragm.

10. The piezoelectric acoustic transducer of claim 9, further comprising an edge extending across a gap between the second board and the non-vibrating fixed frame, the edge being capable of expansion and contraction and supporting the second board via the non-vibrating fixed frame.

11. The piezoelectric acoustic transducer of claim 9, wherein the first piezoelectric element of the first piezoelectric diaphragm has a structure in which a printed wiring formed on a surface of the first board and a flat plate electrode interpose therebetween a piezoelectric member, and wherein the second piezoelectric element of the second piezoelectric diaphragm has a structure in which a printed wiring formed on a surface of the second board and a flat plate electrode interpose therebetween a piezoelectric member.

12. The piezoelectric acoustic transducer of claim 9, wherein the first piezoelectric diaphragm and the second piezoelectric diaphragm are spaced apart in a height direction, wherein the first piezoelectric diaphragm extends from a first edge thereof to a second edge thereof in a width direction perpendicular to the height direction, and wherein the coupling member is disposed between the first edge and the second edge of the first piezoelectric diaphragm in the width direction.

13. The piezoelectric acoustic transducer of claim 9, wherein the coupling member further includes a rectangular frame, and the beam extends from one side of the rectangular frame to an opposite side of the rectangular frame at a middle of the rectangular frame, and wherein the voids disposed on either side of the beam are circumscribed by the rectangular frame.

14. The piezoelectric acoustic transducer of claim 9, wherein the coupling member is configured such that the beam is not displaced as the first and second piezoelectric diaphragms vibrate.

15. The piezoelectric acoustic transducer of claim 1, wherein the non-vibrating fixed frame further includes a rectangular frame, and the beam extends from one side of the rectangular frame to an opposite side of the rectangular frame at a middle of the rectangular frame, and wherein the voids disposed on either side of the beam are circumscribed by the rectangular frame.

16. The piezoelectric acoustic transducer of claim 1, wherein the non-vibrating fixed frame is configured such that the beam is not displaced as the first and second piezoelectric diaphragms vibrate.

17. The piezoelectric acoustic transducer of claim 1, further comprising:

a first outer frame portion disposed outside of a perimeter of the first piezoelectric diaphragm in such a manner as to be flush with the first piezoelectric diaphragm;

a second outer frame portion disposed outside of a perimeter of the second piezoelectric diaphragm in such a manner as to be flush with the second piezoelectric diaphragm;

a first supporting portion coupled to the first outer frame portion to support the first piezoelectric diaphragm in such a manner as to allow the first piezoelectric diaphragm to vibrate, the first supporting portion being disposed flush with the first piezoelectric diaphragm;

a second supporting portion coupled to the second outer frame portion to support the second piezoelectric diaphragm in such a manner so as to allow the second piezoelectric diaphragm to vibrate, the second supporting portion being disposed flush with the first piezoelectric diaphragm; and a second non-vibrating fixed frame disposed between the first outer frame portion and the second outer frame portion.

18. The piezoelectric acoustic transducer according to claim 17, wherein the surround insulates a sound wave from passing through a gap created between the second piezoelectric diaphragm and the second outer frame portion.

19. The piezoelectric acoustic transducer of claim 9, further comprising:

a first outer frame portion disposed outside of a perimeter of the first piezoelectric diaphragm in such a manner as to be flush with the first piezoelectric diaphragm;

a second outer frame portion disposed outside of a perimeter of the second piezoelectric diaphragm in such a manner as to be flush with the second piezoelectric diaphragm;

a first supporting portion coupled to the first outer frame portion to support the first piezoelectric diaphragm in such a manner as to allow the first piezoelectric diaphragm to vibrate, the first supporting portion being disposed flush with the first piezoelectric diaphragm;

a second supporting portion coupled to the second outer frame portion to support the second piezoelectric diaphragm in such a manner so as to allow the second piezoelectric diaphragm to vibrate, the second supporting portion being disposed flush with the first piezoelectric diaphragm; and a second non-vibrating fixed frame disposed between the first outer frame portion and the second outer frame portion.

20. The piezoelectric acoustic transducer of claim 19, wherein the surround insulates a sound wave from passing through a gap created between the second piezoelectric diaphragm and the second outer frame portion.

21. A piezoelectric acoustic transducer that vibrates in accordance with a voltage applied thereto, the piezoelectric acoustic transducer comprising:

a first non-vibrating fixed frame;

a first piezoelectric diaphragm having a first board and a piezoelectric element mounted on at least one main surface of the first board;

a second piezoelectric diaphragm having a second board and a piezoelectric element mounted on at least one main surface of the second board, the second piezoelectric diaphragm having a first surface which is not coupled with the first piezoelectric diaphragm;

a plurality of coupling members which couple the first piezoelectric diaphragm and the second piezoelectric diaphragm to each other and align a vibration axis of the piezoelectric element of the first piezoelectric diaphragm with a vibration axis of the piezoelectric element of the second piezoelectric diaphragm; and a surround which is capable of expansion and contraction and is disposed on the first surface of the second piezoelectric diaphragm in such a manner as to cover an entirety or a part of the first surface, the surround being configured to insulate an antiphase sound wave which is generated from a bottom of the piezoelectric acoustic transducer and which interferes with a sound wave emitted to the front of the piezoelectric acoustic transducer, wherein the polarity of the piezoelectric element of each of the first and second piezoelectric diaphragms is set so that the first and second piezoelectric diaphragms are displaced in directions opposite to each other, in accordance with a voltage applied thereto, and wherein the non-vibrating fixed frame is disposed at a position opposing the second piezoelectric diaphragm with the first piezoelectric diaphragm being interposed therebetween, and is coupled to the first piezoelectric diaphragm in a center of the first board, the piezoelectric acoustic transducer further comprising: a first outer frame portion disposed outside of a perimeter of the first piezoelectric diaphragm in such a manner as to be flush with the first piezoelectric diaphragm;

a second outer frame portion disposed outside of a perimeter of the second piezoelectric diaphragm in such a manner as to be flush with the second piezoelectric diaphragm;

a first supporting portion coupled to the first outer frame portion to support the first piezoelectric diaphragm in such a manner as to allow the first piezoelectric diaphragm to vibrate, the first supporting portion being disposed flush with the first piezoelectric diaphragm;

a second supporting portion coupled to the second outer frame portion to support the second piezoelectric diaphragm in such a manner so as to allow the second piezoelectric diaphragm to vibrate, the second supporting portion being disposed flush with the first piezoelectric diaphragm; and a second non-vibrating fixed frame disposed between the first outer frame portion and the second outer frame portion.

22. The piezoelectric acoustic transducer according to claim 21, wherein the surround insulates a sound wave from passing through a gap created between the second piezoelectric diaphragm and the second outer frame portion.

23. A piezoelectric acoustic transducer that vibrates in accordance with a voltage applied thereto, the piezoelectric acoustic transducer comprising:

a first piezoelectric diaphragm having a first board and a piezoelectric element mounted on at least one main surface of the first board;

a second piezoelectric diaphragm having a second board and a piezoelectric element mounted on at least one main surface of the second board, the second piezoelectric diaphragm having a first surface which is not coupled with the first piezoelectric diaphragm;

a coupling member which couples the first piezoelectric diaphragm and the second piezoelectric diaphragm to each other and aligns a vibration axis of the piezoelectric element of the first piezoelectric diaphragm with a vibration axis of the piezoelectric element of the second piezoelectric diaphragm; and a surround which is capable of expansion and contraction and is disposed on the first surface of the second piezoelectric diaphragm in such a manner as to cover an entirety or a part of the first surface, the surround being configured to insulate an antiphase sound wave which is generated from a bottom of the piezoelectric acoustic transducer and which interferes with a sound wave emitted to the front of the piezoelectric acoustic transducer, wherein the polarity of the piezoelectric element of each of the first and second piezoelectric diaphragms is set so that the first and second piezoelectric diaphragms are displaced in directions opposite to each other, in accordance with a voltage applied thereto, and wherein the first piezoelectric diaphragm is coupled to a first non-vibrating fixed frame at end portions of the first board and along a direction perpendicular to directions in which the piezoelectric element of the first piezoelectric diaphragm expands and contracts, wherein the coupling member couples the first piezoelectric diaphragm to the second piezoelectric diaphragm in a center of the first and second board, the piezoelectric acoustic transducer further comprising:

a first outer frame portion disposed outside of a perimeter of the first piezoelectric diaphragm in such a manner as to be flush with the first piezoelectric diaphragm;

a second outer frame portion disposed outside of a perimeter of the second piezoelectric diaphragm in such a manner as to be flush with the second piezoelectric diaphragm;

a first supporting portion coupled to the first outer frame portion to support the first piezoelectric diaphragm in such a manner as to allow the first piezoelectric diaphragm to vibrate, the first supporting portion being disposed flush with the first piezoelectric diaphragm;

a second supporting portion coupled to the second outer frame portion to support the second piezoelectric diaphragm in such a manner so as to allow the second piezoelectric diaphragm to vibrate, the second supporting portion being disposed flush with the first piezoelectric diaphragm; and a second non-vibrating fixed frame disposed between the first outer frame portion and the second outer frame portion.

24. The piezoelectric acoustic transducer of claim 23, wherein the surround insulates a sound wave from passing through a gap created between the second piezoelectric diaphragm and the second outer frame portion.

* * * * *